(12) United States Patent  
Hiramatsu et al.

(10) Patent No.: US 6,946,308 B2
(45) Date of Patent: Sep. 20, 2005

(54) METHOD OF MANUFACTURING III-V GROUP COMPOUND SEMICONDUCTOR

(75) Inventors: Kazumasa Hiramatsu, Yokkaichi (JP); Hideto Miyake, Hisai (JP); Shinya Bohyama, Mie (JP); Takayoshi Maeda, Nabari (JP); Yasushi Iyechika, Matsudo (JP)

(73) Assignee: Sumitomo Chemical Company, Limited, Osaka (JP)

( * ) Notice: Subject to any disclaimer, the term of this patent is extended or adjusted under 35 U.S.C. 154(b) by 182 days.

(21) Appl. No.: 10/396,565

(22) Filed: Mar. 26, 2003

(65) Prior Publication Data

US 2003/0211710 A1 Nov. 13, 2003

(30) Foreign Application Priority Data

Mar. 26, 2002 (JP) ........................................ 2002-084851
Jul. 19, 2002 (JP) ........................................ 2002-211603

(51) Int. Cl.$^7$ ............................ H01L 21/00; H01L 33/00
(52) U.S. Cl. ............................................ 438/26; 257/99
(58) Field of Search ................................ 438/26; 257/99

(56) References Cited

U.S. PATENT DOCUMENTS 6,440,823 B1  8/2002  Vaudo et al.

2001/0031385 A1 * 10/2001 Hiramatsu et al. .......... 428/698
2002/0145148 A1 * 10/2002 Okuyama et al. ............. 257/88
2003/0045017 A1    3/2003 Hiramatsu et al.

FOREIGN PATENT DOCUMENTS

WO    WO 02/01608 A2    1/2002
WO    WO 02/20880 A1    3/2002

* cited by examiner

Primary Examiner—Carl Whitehead, Jr.
Assistant Examiner—Nema Berezny
(74) Attorney, Agent, or Firm—Birch, Stewart, Kolasch & Birch, LLP

(57) ABSTRACT

When a crystal layer of III-V Group nitride compound semiconductor is formed, a nitride compound semiconductor layer is first overlaid on a substrate to form a base layer and a III-V Group nitride compound semiconductor represented by the general formula $In_xGa_yAl_zN$ (where $0 \leq x \leq 1$, $0 \leq y \leq 1$, $0 \leq z \leq 1$, $x+y+z=1$) is epitaxially grown on the base layer by hydride vapor phase epitaxy at a deposition pressure of not lower than 800 Torr. By making the deposition pressure not lower than 800 Torr, the crystallinity of the III-V Group nitride compound semiconductor can be markedly improved and its defect density reduced.

7 Claims, 5 Drawing Sheets

XRC half − value width in homoepitaxial growth ($N_2 : H_2 = 1 : 1$)

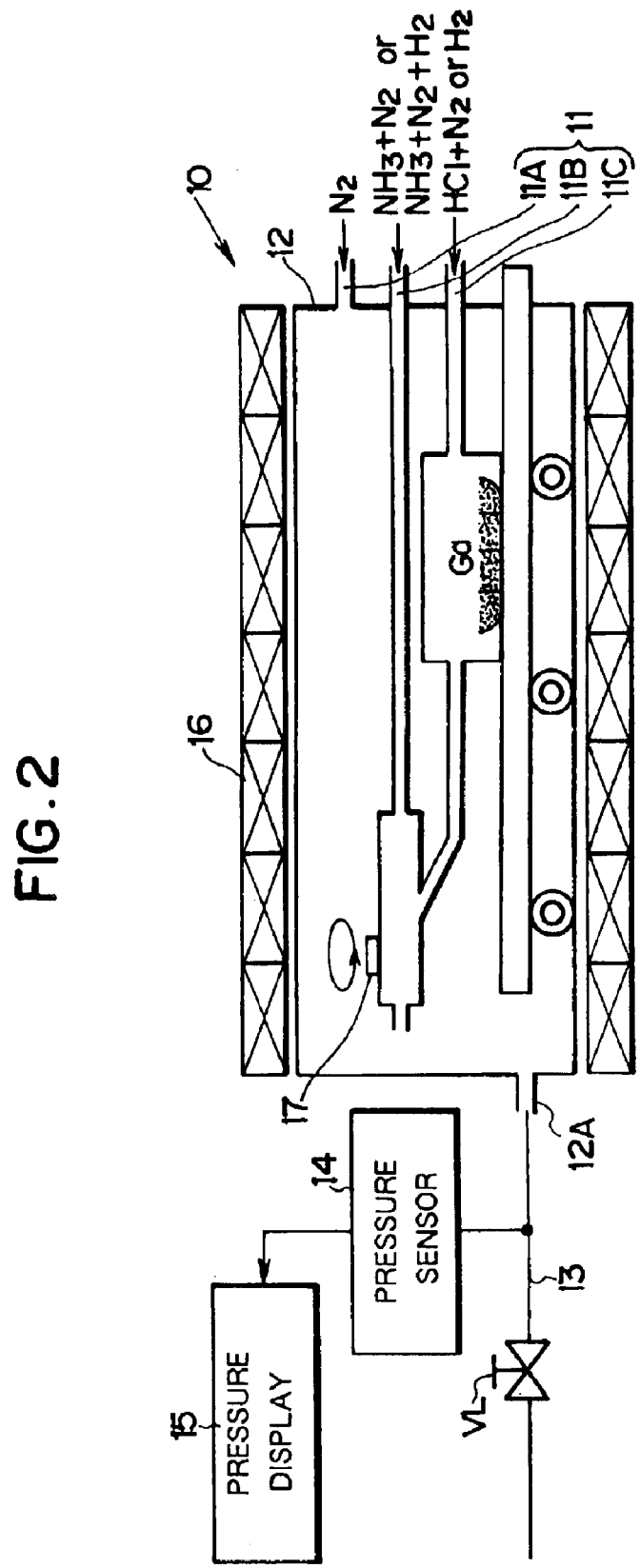

XRC half – value width in homoepitaxial growth
($N_2 : H_2 = 1 : 1$)

US 6,946,308 B2

METHOD OF MANUFACTURING III-V GROUP COMPOUND SEMICONDUCTOR

This nonprovisional application claims priority under 35 U.S.C. § 119(a) on Patent Application No(s) 2002-084851 and 2002-211603 filed in JAPAN on Mar. 26, 2002 and Jul. 19, 2002, which is(are) herein incorporated by reference.

BACKGROUND OF THE INVENTION

1. Field of the Invention

The present invention relates to a method of manufacturing III-V nitride compound semiconductor by hydride vapor phase epitaxy (HVPE).

2. Background Art

III-V Group nitride compound semiconductors represented by the general formula $In_xGa_yAl_zN$ (where $0 \leq x \leq 1$, $0 \leq y \leq 1$, $0 \leq z \leq 1$, x+y+z=1) can be adjusted in direct band gap energy by varying the III Group element content. As this makes them adaptable to optical energies of wavelengths from ultraviolet to red, they are usable as high-efficiency light-emitting element materials over a range extending from ultraviolet to visible light. Moreover, since they have a larger band gap than Si, GaAs and other such semiconductors widely used up to now, they can maintain the characteristics of a semiconductor up to high temperatures at which conventional semiconductors cannot operate. This property is basically utilizable to fabricate electronic devices with excellent environmental resistance.

Owing to the very high vapor pressure of the III-V Group nitride compound semiconductors in the vicinity of the melting point, however, growth of a large crystal is extremely difficult and a crystal of a size practical for use as a substrate for fabricating semiconductor chips cannot be obtained. The general practice in fabricating compound semiconductors is therefore to use a substrate of Si, GaAs, SiC, sapphire, $ZrB_2$ or other material that has a crystal structure similar to the compound semiconductor and enables large crystal fabrication and to epitaxially grow a desired single crystal thin-film layer on the substrate. Relatively good quality crystals of these compound semiconductors have now become obtainable by using this method. By using the metalorganic vapor phase epitaxial (MOVPE) method to conduct growth using a buffer layer, it is generally possible to achieve a half-value width for (0004) of around 200 seconds as measured from the x-ray rocking curve.

On the other hand, hydride vapor phase epitaxy (HVPE) compares favorably with other methods of growing compound semiconductor in the points of high growth rate and ability to achieve high-purity crystal growth by suppressing incorporation of impurities. However, HVPE lags behind MOVPE and other methods in the establishment of a heteroepitaxial method enabling two-stage growth using a buffer layer. In actual practice, a thin film of around 3 $\mu$m thickness grown by MOVPE or the like is used as a base layer and a thick layer of the compound semiconductor is homoepitaxially grown on the base layer by HVPE. As cracking occurs even when homoepitaxial growth is conducted by HVPE, however, it is difficult to obtain high-quality crystal over a wide area. Other drawbacks have also come to light, such as that crystallinity of the grown layer is inferior to that of the base layer, as evidenced by the fact that the half-value width of the x-ray rocking curve (XRC) of the grown layer is broader than that of the base layer.

SUMMARY OF THE INVENTION

An object of the present invention is to provide a method for obtaining high-quality III-V Group compound semiconductor crystal.

Another object of the present invention is to provide a method of growing III-V Group compound semiconductor crystal excellent in crystallinity by HVPE.

Another object of the present invention is to provide a method of manufacturing III-V Group compound semiconductor that enables epitaxial growth of III-V Group compound semiconductor excellent in crystallinity at low cost.

The inventors conducted numerous and various tests and experiments to achieve this object. These were premised on the thinking that, while growth of GaN crystal by HVPE is usually conducted at atmospheric pressure, it is conceivable that crystallinity may be affected by growth pressure change. This approach led to the discovery that crystal quality improves markedly when the deposition pressure is slightly higher than atmospheric pressure. The present invention was accomplished based on this finding.

The method of manufacturing III-V Group nitride compound semiconductor by HVPE according to the present invention is characterized in that the deposition pressure is set to not lower than 800 Torr. The deposition pressure is preferably not lower than 850 Torr, more preferably not lower than 900 Torr. The effect of this invention cannot be obtained when the deposition pressure is lower than 800 Torr.

In accordance with another feature of the present invention, when a crystal layer of III-V Group nitride compound semiconductor represented by the general formula $In_xGa_yAl_zN$ (where $0 \leq x \leq 1$, $0 \leq y \leq 1$, $0 \leq z \leq 1$, x+y+z=1) is formed by by hydride vapor phase epitaxy, a crystal layer of III-V Group compound semiconductor excellent in crystallinity can be obtained by preparing a substrate and forming the III-V Group nitride compound semiconductor on the substrate under a deposition pressure of not lower than 800 Torr.

The substrate can be appropriately selected from among materials such as Si, GaAs, SiC, $ZrB_2$ and sapphire. Use can also be made of a substrate of nitride compound semiconductor grown on one of the foregoing substrates beforehand by MOVPE, molecular beam epitaxy (MBE) or the like. When a III-V Group nitride compound semiconductor is epitaxially grown on such a substrate using HVPE, the crystallinity of the III-V Group nitride compound semiconductor obtained can be markedly improved over that using atmospheric pressure deposition by setting the deposition pressure slightly higher than atmospheric pressure. The reason for this is not certain but is considered to be that the pressurization alters the growth mechanism in a manner that upgrades the crystallinity. It is also possible to first form a nitride compound semiconductor layer on the substrate and thereafter grow the required III-V Group nitride compound semiconductor crystal layer on the nitride compound semiconductor layer by hydride vapor phase epitaxy under a deposition pressure of not lower than 800 Torr.

BRIEF EXPLANATION OF THE DRAWINGS

FIG. 2 is a schematic diagram showing the principal parts of a vapor deposition semiconductor manufacturing system used to conduct the processes of FIGS. 1A–1D.

DESCRIPTION OF THE PREFERRED EMBODIMENTS

Figure 1A:
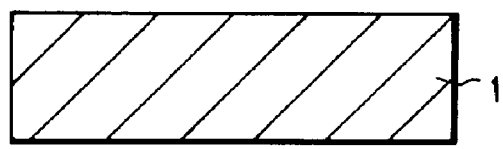
FIGS. 1A–1D are process diagrams for explaining a method that is an embodiment of the present invention.

FIGS. 1A–1D are process diagrams for explaining a method that is an embodiment of the present invention. First, a sapphire substrate 1 of appropriate size is prepared by washing to remove oil and water (FIG. 1A). The washing can be done using any of various known cleansing fluids.

Figure 1B:
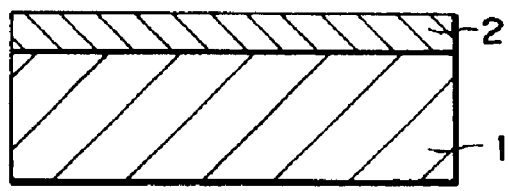
Figure 1C:
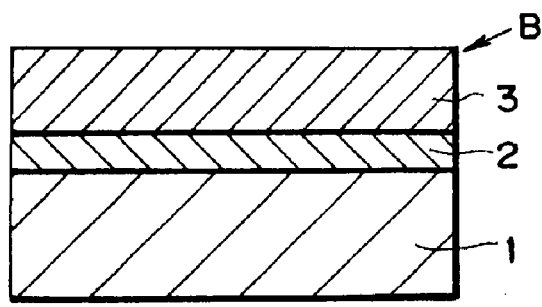
Figure 1D:
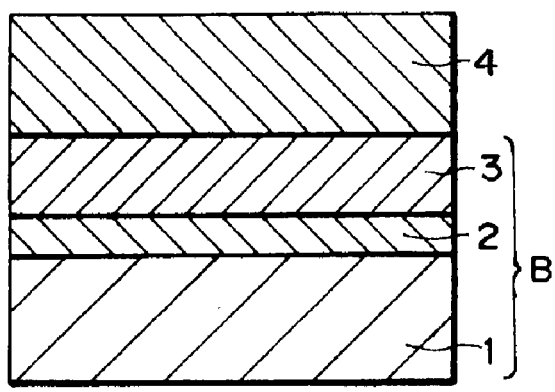

Next, the washed sapphire substrate 1 is placed in an MOVPE reactor and surface etching is conducted at a high temperature of around 1000° C. A buffer layer 2 of, for example, AlN, GaN, AlGaN or SiC is then grown at a temperature of about 500° C. (FIG. 1B). After formation of the buffer layer 2, the temperature is returned to about 1000° C. and a III-V Group nitride compound semiconductor layer 3 is formed (FIG. 1C). The multilayered semiconductor crystal obtained in this manner is used as a base layer B in this invention. The obtained base layer B is set in an HVPE reactor to epitaxially grow a III-V Group nitride compound semiconductor represented by the general formula $In_xGa_yAl_zN$ (where $0 \leq x \leq 1$, $0 \leq y \leq 1$, $0 \leq z \leq 1$, x+y+z=1). The compound semiconductor grown in this embodiment is GaN. As a result, there is obtained a GaN thin film 4 (FIG. 1D). The epitaxial growth of the GaN thin film 4 on the base layer B can be conducted under temperature conditions appropriately selected from among those known to the art but the deposition pressure must be not lower than 800 Torr. The use of a deposition pressure of 800 Torr or higher, i.e., one slightly higher than atmospheric pressure, markedly improves the crystal quality of the GaN thin film 4 over that obtained at atmospheric pressure.

FIG. 2 is a schematic diagram showing the principal parts of a vapor deposition semiconductor manufacturing system 10 that is an example of an HVPE semiconductor manufacturing system usable for implementing the method of the present invention.

The vapor deposition semiconductor manufacturing system 10 is equipped with a reactor 12 that is supplied through material supply lines 11 with source gases from a starting material supply system (not shown). A susceptor 17 is provided in the reactor 12 for placement and heating of the base layer B. The starting material supply lines 11 consist of a first line 11A for supplying $N_2$ purging gas, a second line 11B for supplying $NH_3$ and carrier gas, and a third line 11C for supplying HCl and carrier gas. The carrier gas supplied by the second line 11B can be $N_2$ or $H_2$ alone or a mixture of $N_2$ and $H_2$. The carrier gas supplied by the third line 11C can also be $N_2$ or $H_2$ alone or a mixture of $N_2$ and $H_2$.

An exhaust line 13 is connected to an exhaust port 12A of the reactor 12. The flow rate of exhaust gas discharged through the exhaust line 13 is regulated by a flow rate control valve VL provided in the exhaust line 13. This enables control of the pressure in the reactor 12. The deposition pressure of the reactor 12 can therefore be controlled to the desired value by regulating the flow rate control valve VL.

The pressure in the reactor 12 is detected by a pressure sensor 14. The output of the pressure sensor 14 is sent to pressure display 15 by which the deposition pressure in the reactor 12 can be monitored. In this embodiment, the pressure sensor 14 is attached to the exhaust line 13 between the exhaust port 12A and the flow rate control valve VL to enable detection of the pressure in the reactor 12.

Figure 3:
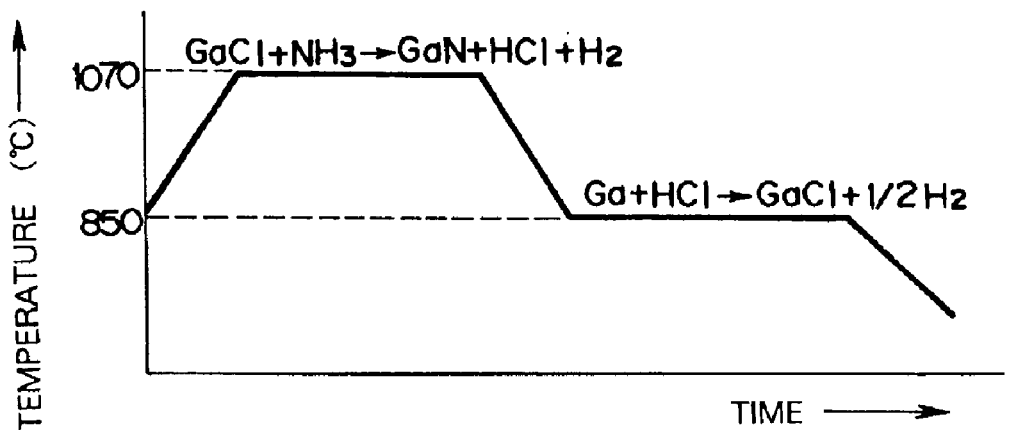
FIG. 3 is a graph showing a temperature profile in the reactor of the system shown in FIG. 2.

An electric furnace 16 is provided for heating the susceptor 17. The reactor 12 can be heated to establish the required deposition temperature profile by supplying the electric furnace 16 with heating current from a power source (not shown). FIG. 3 shows an example of the deposition temperature profile in the reactor 12.

In the vapor deposition semiconductor manufacturing system 10 of the foregoing configuration, source gases supplied to the reactor 12 through the starting material supply lines 11 react on the base layer B (omitted in FIG. 2) placed on the susceptor 17 heated by the electric furnace 16 to vapor deposit the desired GaN thin film on the base layer B. The used gas is discharged to the exterior through the exhaust port 12A to be sent through the exhaust line 13 to an exhaust gas treatment apparatus (not shown).

This process will be explained more specifically. The base layer B obtained in the process of FIG. 1C is placed on the susceptor 17 in the reactor 12, source gas is supplied into the reactor 12, and the GaN thin film 4 is grown on the base layer B using a profile of the deposition temperature like that shown in FIG. 3, for example (FIG. 1D).

While keeping an eye on the pressure display 15, the operator regulates the flow rate control valve VL to control the flow rate of the exhaust gas passing through the exhaust line 13 and thereby establish a flow rate of the source gas that maintains the deposition pressure in the reactor 12 at 800 Torr, for instance.

A high-quality GaN thin film 4 is thus gown on the base layer B by, as explained with reference to FIG. 1D, maintaining the deposition pressure slightly higher than atmospheric pressure, i.e., at 800 Torr or higher. When a III-V Group nitride compound semiconductor is epitaxially grown by HVPE, a III-V Group nitride compound semiconductor having very good crystallinity can be manufactured merely by setting the deposition pressure slightly higher than atmospheric pressure. The present invention thus offers a method of outstanding industrial value for its ability to manufacture high-quality III-V Group compound semiconductor at low cost.

The embodiment of the invention explained in the foregoing relates to the case of growing a GaN thin film 4 on the base layer B. However, the present invention is not limited to this embodiment and can, for example, provide the same excellent effect when applied to regrow a GaN layer by ELO (epitaxial layer overgrowth). The present invention can also be directly applied when a substrate of a material with a lattice constant relatively close to that of the compound semiconductor to be produced is used as the base layer.

Working Examples

EXAMPLE 1

The vapor deposition semiconductor manufacturing system 10 shown in FIG. 2 was used as set out below to epitaxially grow a GaN thin film on a base layer of GaN formed on a sapphire substrate by MOVPE.

The temperature in the reactor 12 was controlled by regulating the flow rate control valve VL concomitantly with temperature increase, and the temperature profile in the reactor 12 was established as shown in FIG. 3. The starting materials were supplied at a constant V/III ratio of 25 ($NH_3$ partial pressure: 0.2 atm, GaCl partial pressure: $8 \times 10^{-3}$ atm) and growth was conducted with the internal pressure of the reactor 12 controlled to 910 Torr. As the flow rate was constant, the carrier gas flow rate was varied with pressure.

The experiment was conducted using a mixed carrier gas composed of equal amounts of $N_2$ and $H_2$ ($N_2:H_2=1:1$). Specimens for comparison were produced at pressures of 300 Torr and 760 Torr.

Figure 4:
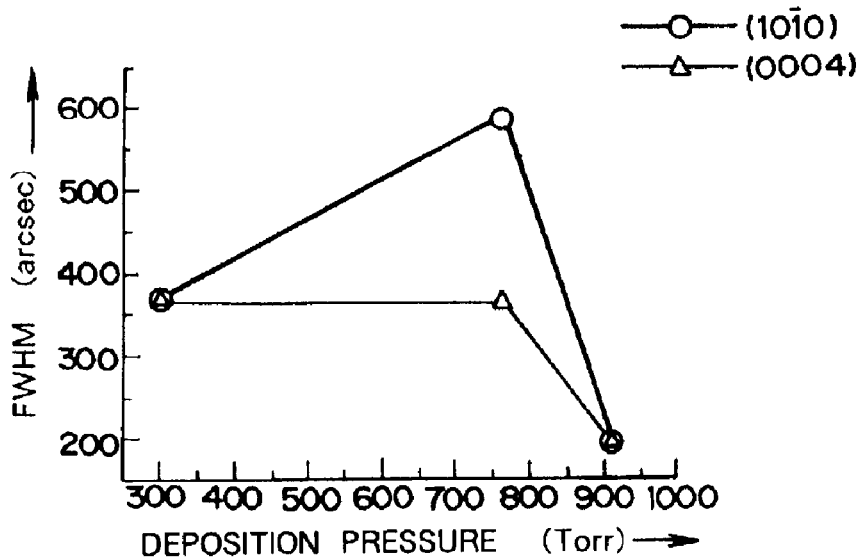
FIG. 4 is a graph showing how XRC half-value width varies as a function of deposition pressure in specimens manufactured according to the present invention.

The invention specimen produced at a deposition pressure of 910 Torr and the specimens for comparison produced at deposition pressures of 300 Torr and 760 Torr were evaluated for crystallinity by x-ray diffraction analysis. Change in the half-value width of XRC (x-ray rocking curve) for (0004) and (10—10) obtained by the analysis is plotted as a function of the deposition pressure in FIG. 4. In both the (0004) and (10—10) diffraction results, the half-value width (FWHM: full width at half-maximum) was smallest when the deposition pressure was 910 Torr, and the improvement in crystallinity over the specimens obtained at deposition pressures of 300 Torr and 760 Torr was pronounced. These results demonstrate that the crystallinity of GaN thin film improves when the deposition pressure is increased.

Figure 5:
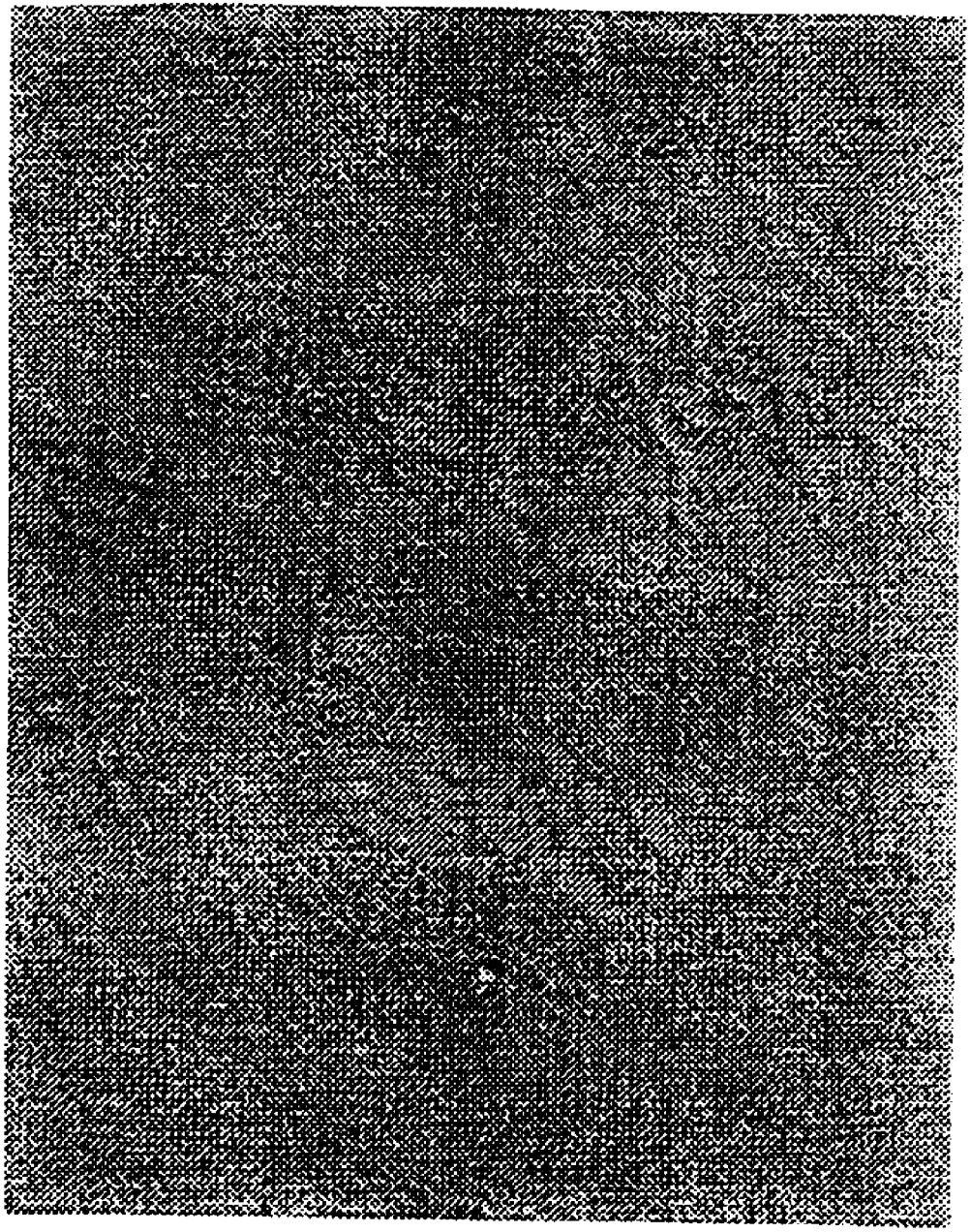
FIG. 5 is a micrograph showing the GaN thin film surface state of a specimen manufactured according to the present invention.
Figure 6:
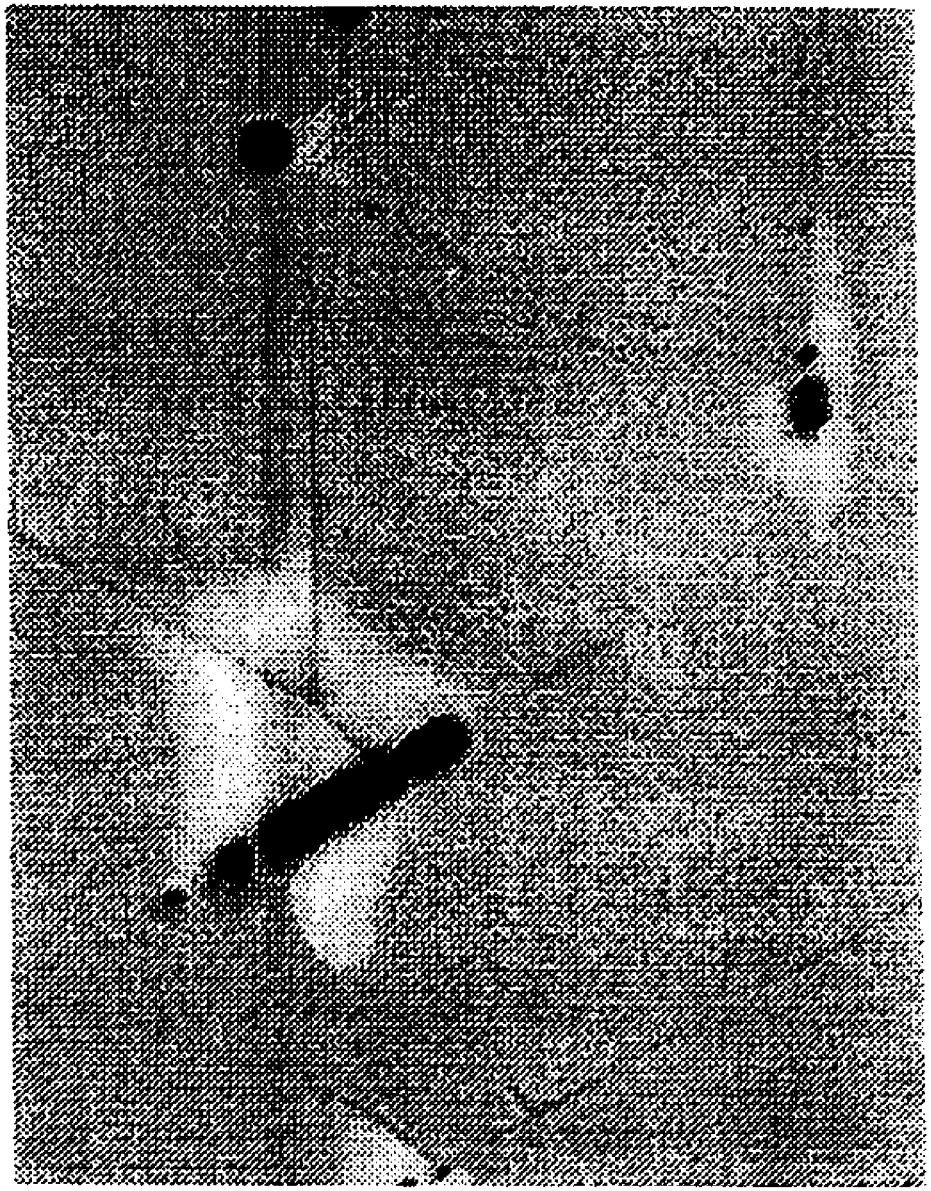
FIG. 6 is a micrograph showing the GaN thin film surface state of a specimen manufactured by a conventional method.

FIG. 5 shows the surface state of the GaN thin film grown at a deposition pressure of 910 Torr. FIG. 6 shows the surface state of a GaN thin film grown at a conventional deposition pressure of 760 Torr. Observation of the two surfaces confirmed that crack occurrence could be suppressed to obtain a markedly better surface state solely by increasing the deposition pressure from 760 Torr to 910 Torr.

EXAMPLE 2

A specimen was manufactured by growing a GaN thin film on a base layer of GaN formed on a sapphire substrate by MOVPE. The same method as in Example 1 was used expect for changing the deposition pressure to 836 Torr. The surface morphology of the specimen was observed with an optical microscope. The surface was found to be free of cracks and of excellent quality like that of Example 1. The half-value width of the (0004) and (10—10) diffractions were measured and found to be 175 seconds and 220 seconds, indicating good crystallinity on a par with that in Example 1.

As explained in the foregoing, the present invention enables manufacture of a III-V Group nitride compound semiconductor exhibiting excellent crystallinity simply by setting the deposition pressure slightly higher than atmospheric pressure when epitaxially growing a III-V Group nitride compound semiconductor by HVPE. The present invention thus offers a method of outstanding industrial value for its ability to manufacture high-quality III-V Group compound semiconductor at low cost.

What is claimed is:

1. A method of manufacturing III-V Group compound semiconductor comprising: a step of forming a crystal layer of a III-V Group nitride compound semiconductor represented by the general formula $In_xGa_yAl_zN$ (where $0 \leq x \leq 1$, $0 \leq y \leq 1$, $0 \leq z \leq 1$, $x+y+z=1$) by hydride vapor phase epitaxy, wherein deposition pressure during growth of the III-V Group nitride compound semiconductor is not lower than 800 Torr.

2. A method of manufacturing III-V Group compound semiconductor according to claim 1, wherein substrate is prepared and the III-V Group nitride compound semiconductor is formed on the substrate.

3. A method of manufacturing III-V Group compound semiconductor according to claim 2, wherein the substrate is one member selected from among Si, GaAs, SiC, $ZrB_2$ and sapphire.

4. A method of manufacturing III-V Group compound semiconductor according to claim 2, where in a nitride compound semiconductor layer is first overlaid on the substrate to form a base layer and the III-V Group nitride compound semiconductor is formed on the base layer.

5. A method of manufacturing III-V Group compound semiconductor according to claim 4, wherein the nitride compound semiconductor layer is formed on the substrate by MOVPE or MBE.

6. A method of manufacturing III-V Group compound semiconductor according to claim 1, wherein the deposition pressure is not lower than 850 Torr.

7. A method of manufacturing III-V Group compound semiconductor according to claim 1, wherein the deposition pressure is not lower than 900 Torr.

* * * * *